(12) United States Patent
Zhang et al.

(10) Patent No.: US 9,553,146 B2
(45) Date of Patent: Jan. 24, 2017

(54) THREE DIMENSIONAL NAND DEVICE HAVING A WAVY CHARGE STORAGE LAYER

(71) Applicant: SanDisk Technologies Inc., Plano, TX (US)

(72) Inventors: Yanli Zhang, San Jose, CA (US); Matthias Baenninger, Palo Alto, CA (US); Akira Matsudaira, San Jose, CA (US); Yao-Sheng Lee, Tampa, FL (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/297,106

(22) Filed: Jun. 5, 2014

(65) Prior Publication Data

US 2015/0357413 A1   Dec. 10, 2015

(51) Int. Cl.
   *H01L 29/792* (2006.01)
   *H01L 29/10* (2006.01)
   *H01L 27/115* (2006.01)

(52) U.S. Cl.
   CPC ....... *H01L 29/1029* (2013.01); *H01L 27/1157* (2013.01); *H01L 27/11582* (2013.01)

(58) Field of Classification Search
   None
   See application file for complete search history.

(56) References Cited

U.S. PATENT DOCUMENTS

| | | |
|---|---|---|
| 5,583,360 A | 12/1996 | Roth et al. |
| 5,897,354 A | 4/1999 | Kachelmeier |
| 5,915,167 A | 6/1999 | Leedy |
| 6,238,978 B1 | 5/2001 | Huster |
| 6,953,697 B1 | 10/2005 | Castle et al. |
| 7,005,350 B2 | 2/2006 | Walker et al. |
| 7,023,739 B2 | 4/2006 | Chen et al. |

(Continued)

FOREIGN PATENT DOCUMENTS

WO   WO02/15277 A2   2/2002

OTHER PUBLICATIONS

Endoh et al., "Novel Ultra High Density Memory with a Stacked-Surrounding Gate Transistor (S-SGT) Structured Cell," IEDM Proc., (2001), 33-36.

(Continued)

*Primary Examiner* — Duy T Nguyen
*Assistant Examiner* — Bo Bin Jang
(74) *Attorney, Agent, or Firm* — The Marbury Law Group PLLC

(57) ABSTRACT

A monolithic three dimensional NAND string includes a semiconductor channel, where at least one end portion of the semiconductor channel extending substantially perpendicular to a major surface of a substrate, a plurality of control gate electrodes extending substantially parallel to the major surface of the substrate, an interlevel insulating layer located between adjacent control gate electrodes, a blocking dielectric layer located in contact with the plurality of control gate electrodes and an interlevel insulating layer, a charge storage layer located at least partially in contact with the blocking dielectric layer, and a tunnel dielectric located between the charge storage layer and the semiconductor channel. The charge storage layer has a curved profile.

18 Claims, 12 Drawing Sheets

(56) References Cited

U.S. PATENT DOCUMENTS

| | | |
|---|---|---|
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,237,213 B2 | 8/2012 | Liu |
| 8,349,681 B2 | 1/2013 | Alsmeier et al. |
| 8,461,000 B2 | 6/2013 | Alsmeier et al. |
| 8,580,639 B2 | 11/2013 | Alsmeier et al. |
| 2007/0210338 A1 | 9/2007 | Orlowski |
| 2007/0252201 A1 | 11/2007 | Kito et al. |
| 2008/0173928 A1 | 7/2008 | Arai et al. |
| 2009/0283819 A1* | 11/2009 | Ishikawa ........... H01L 21/28282 |
| | | 257/324 |
| 2009/0294828 A1 | 12/2009 | Ozawa et al. |
| 2010/0044778 A1 | 2/2010 | Seol et al. |
| 2010/0120214 A1 | 5/2010 | Park et al. |
| 2010/0155810 A1 | 6/2010 | Kim et al. |
| 2010/0155818 A1 | 6/2010 | Cho et al. |
| 2010/0213527 A1 | 8/2010 | Shim et al. |
| 2011/0063916 A1* | 3/2011 | Maeda ................... G11C 16/04 |
| | | 365/185.17 |
| 2011/0076819 A1* | 3/2011 | Kim .................. H01L 27/11551 |
| | | 438/279 |
| 2012/0012921 A1 | 1/2012 | Liu |
| 2013/0237024 A1 | 9/2013 | Alsmeier et al. |
| 2014/0045307 A1 | 2/2014 | Alsmeier et al. |
| 2014/0084357 A1 | 3/2014 | Choi et al. |
| 2014/0131787 A1 | 5/2014 | Alsmeier |
| 2014/0175530 A1 | 6/2014 | Chien et al. |

OTHER PUBLICATIONS

Katsumata et al., "Pipe-shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-shaped BiCS Flash Memory," 2009 Symposium on VLSI Technology Digest of Technical Papers, pp. 22-23.

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

U.S. Appl. No. 14/283,431, filed May 21, 2014, SanDisk Technologies Inc.

International Search Report and Written Opinion of the International Searching Authority for PCT/US2015/031664, dated Jul. 30, 2015, 10 pages.

* cited by examiner

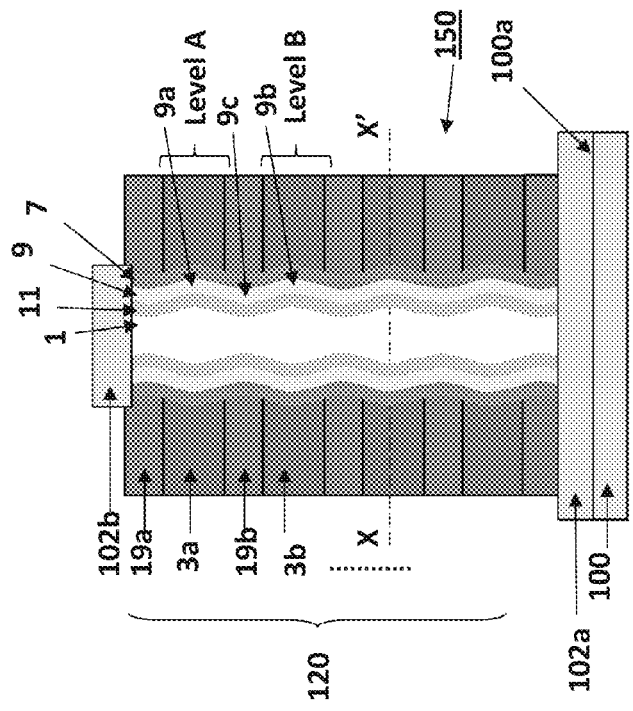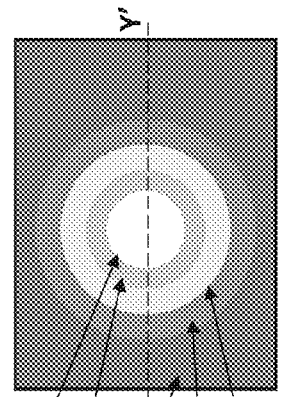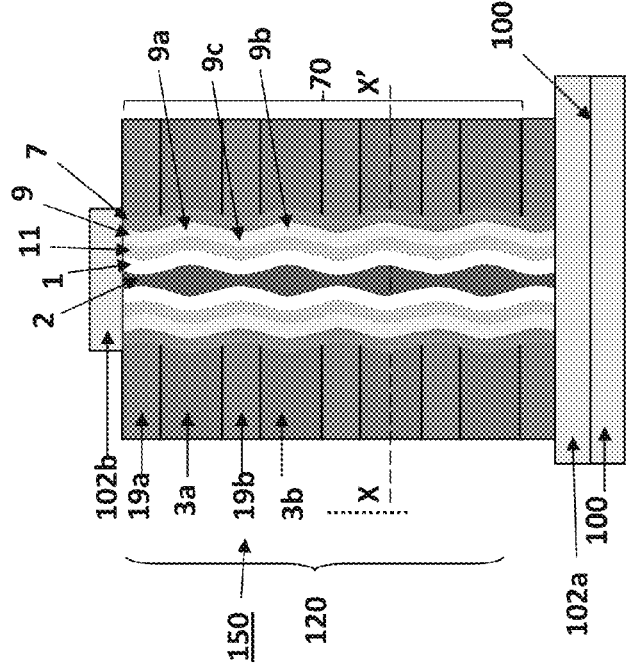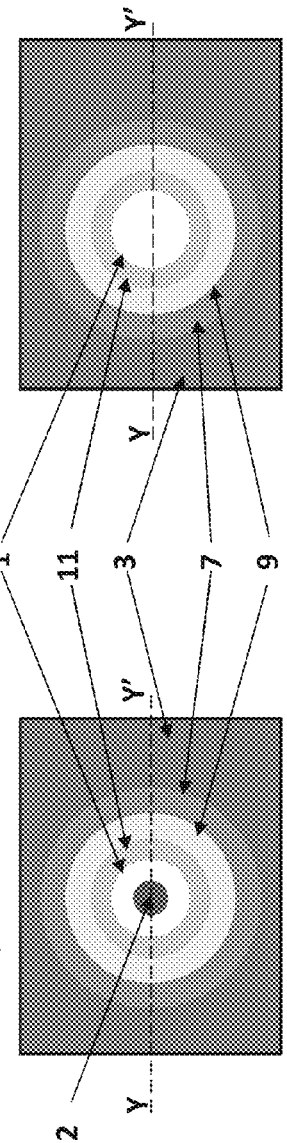

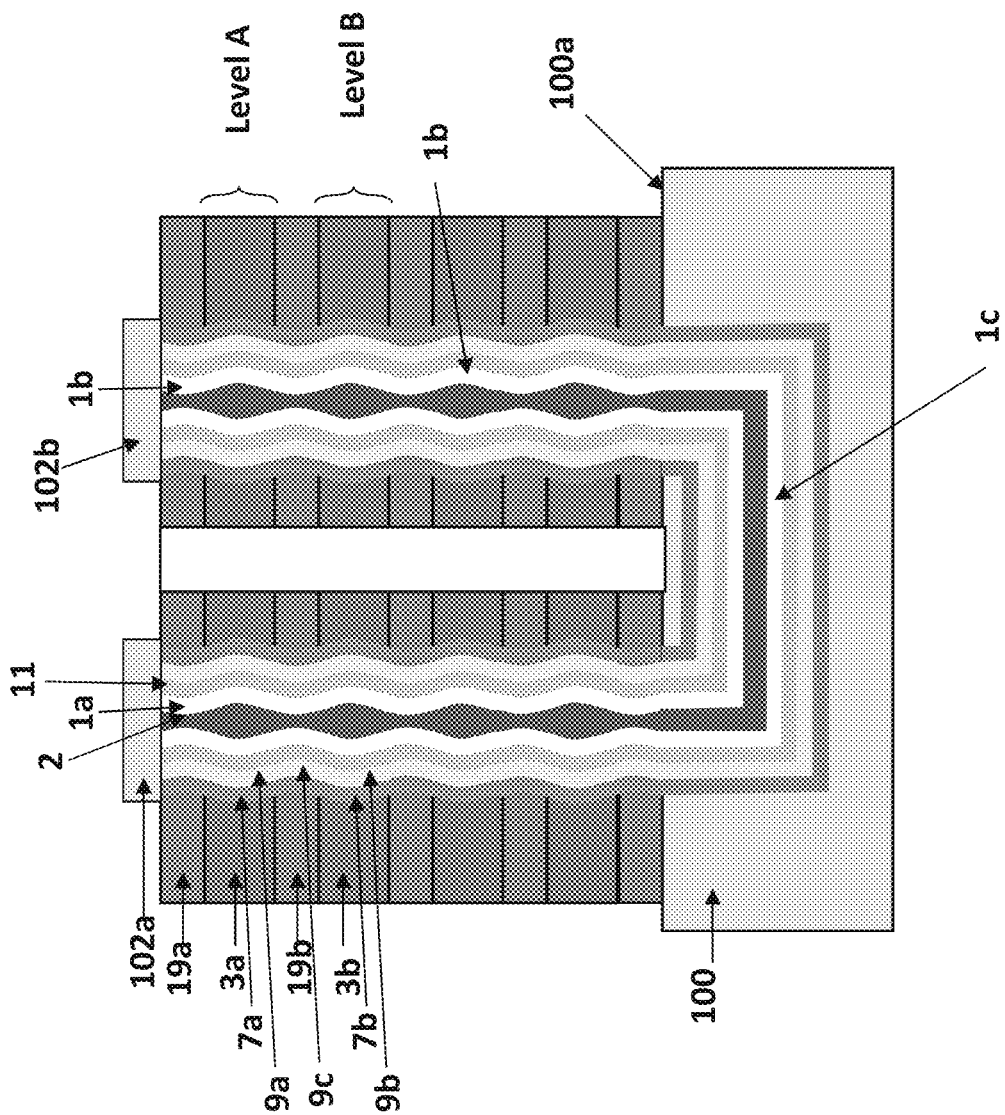

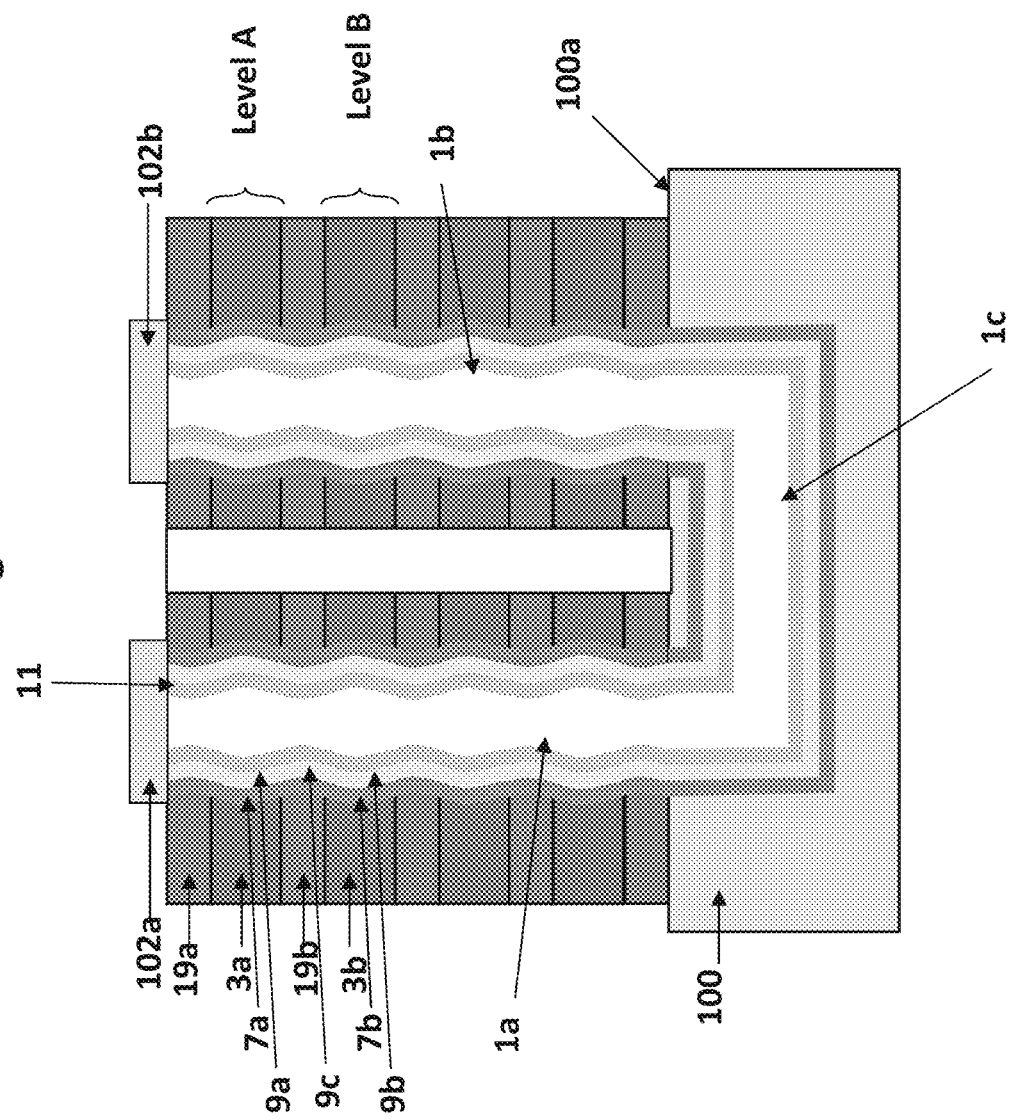

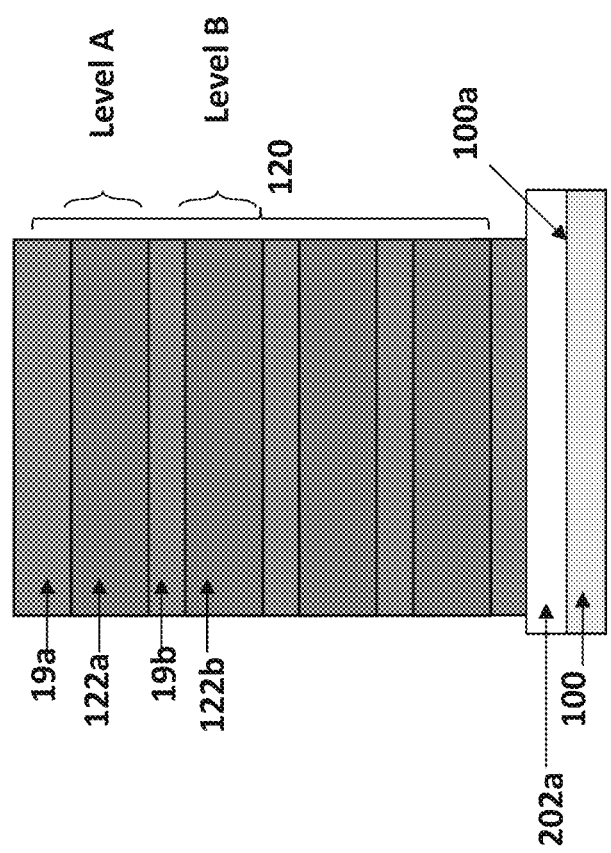

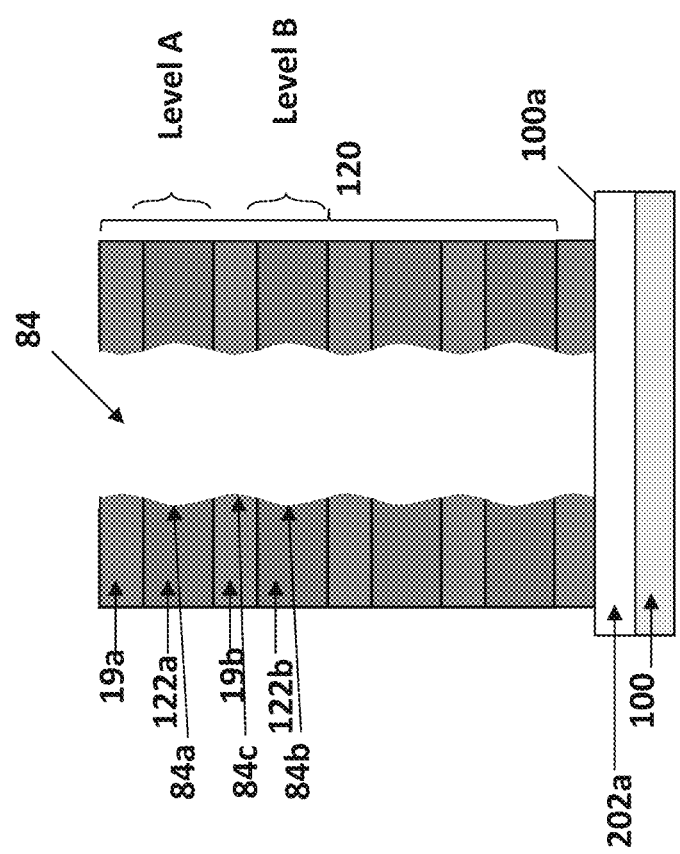

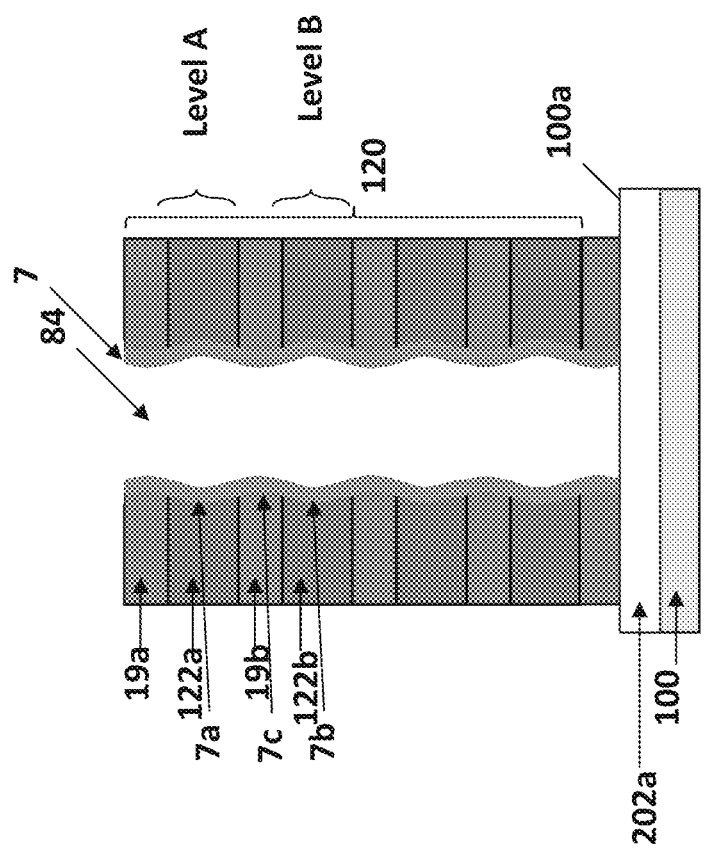

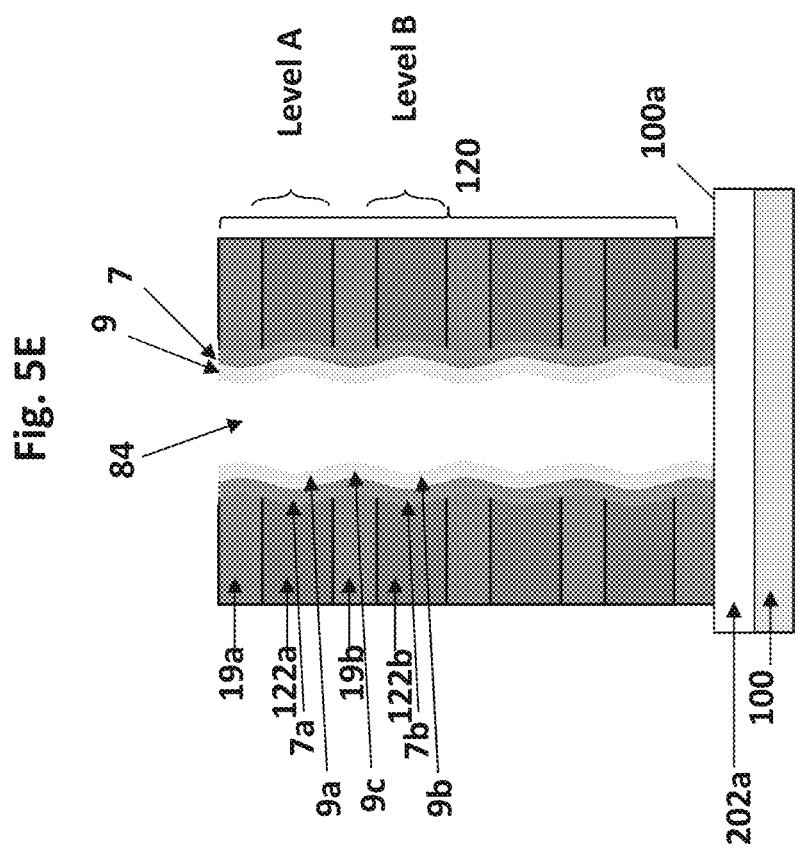

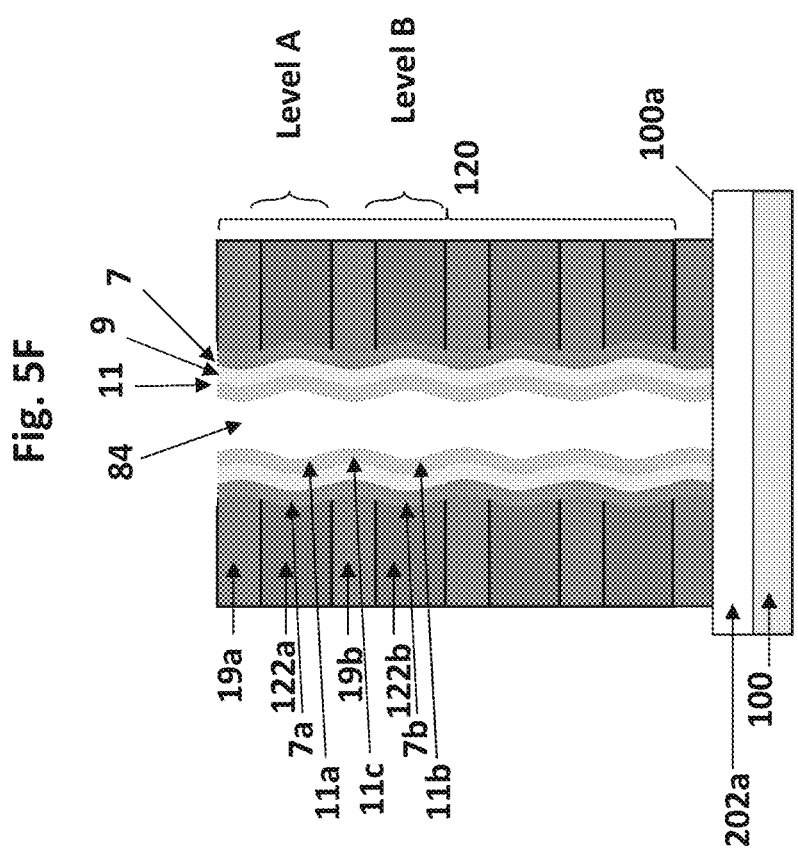

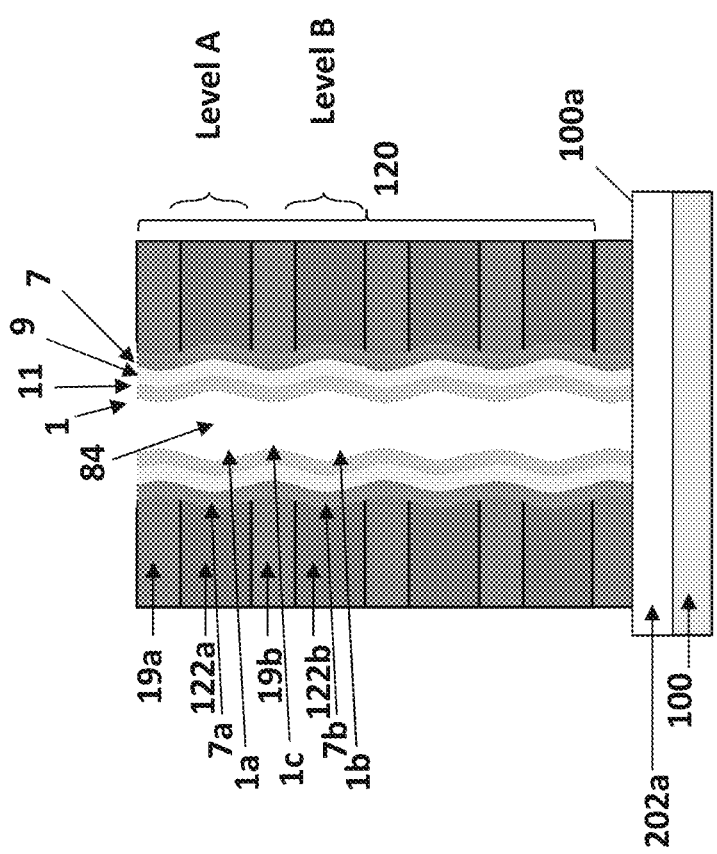

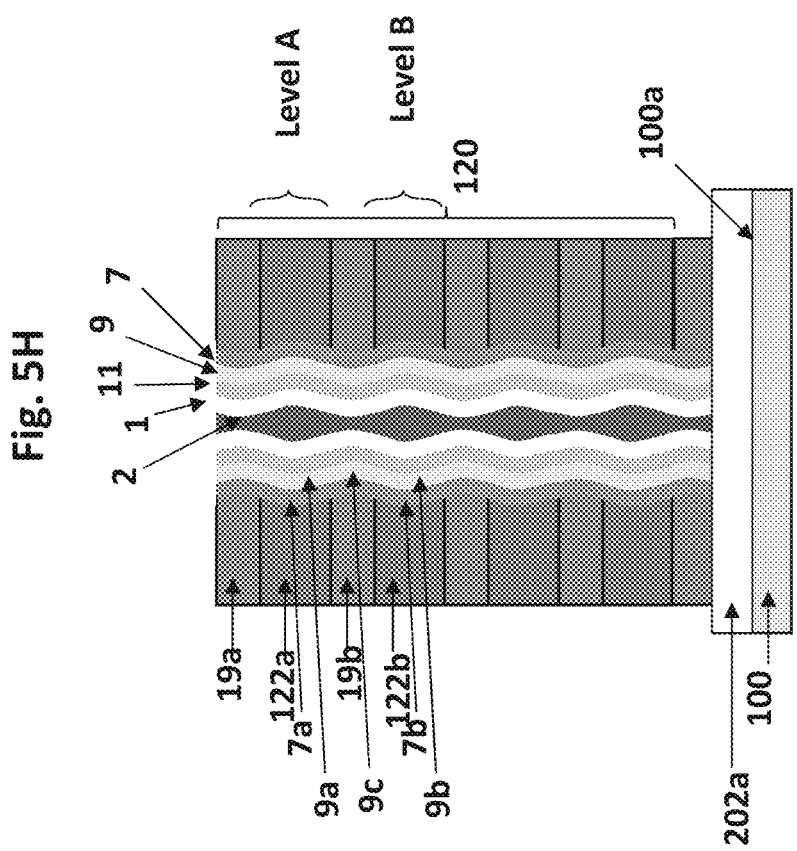

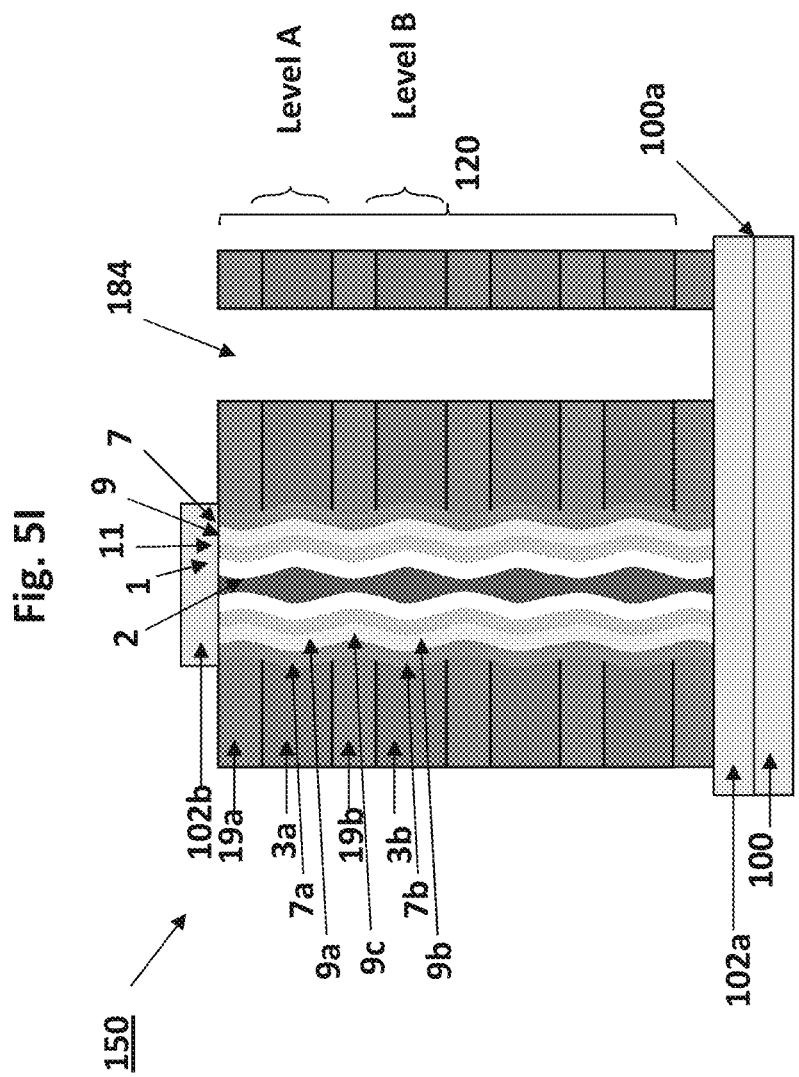

THREE DIMENSIONAL NAND DEVICE HAVING A WAVY CHARGE STORAGE LAYER

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

According to one embodiment of the invention, a method of making a monolithic three dimensional NAND string comprises forming a stack of alternating first layers and second layers, wherein the first layers comprise an insulating material; etching the stack to form at least one opening in the stack to form a first curved profile in the first layers in the at least one opening and to form a second curved profile in the second layers in the at least one opening, wherein the second curved profile is different from the first curved profile; forming a charge storage layer in the at least one opening; forming a tunnel dielectric over the charge storage layer in the at least one opening; and forming a semiconductor channel over the tunnel dielectric in the at least one opening.

According to another embodiment of the invention, a monolithic, three dimensional NAND string comprises a semiconductor channel, at least one end portion of the semiconductor channel extending substantially perpendicular to a major surface of a substrate; a plurality of control gate electrodes extending substantially parallel to the major surface of the substrate, the plurality of control gate electrodes comprising at least a first control gate electrode located in a first device level and a second control gate electrode located in a second device level located over the major surface of the substrate and below the first device level; an interlevel insulating layer located between the first control gate electrode and the second control gate electrode; a blocking dielectric layer located in contact with the plurality of control gate electrodes and the interlevel insulating layer; a charge storage layer located at least partially in contact with the blocking dielectric layer, and comprising at least a first charge storage segment located in the first device level, a second charge storage segment located in the second device level, and a third charge storage segment located adjacent to the interlevel insulating layer between the first device level and the second device level; and a tunnel dielectric located between the charge storage layer and the semiconductor channel. The charge storage layer has a curved profile along at least one of the first charge storage segment and the third charge storage segment.

Another embodiment relates to a monolithic three dimensional NAND string including a semiconductor channel, at least one end portion of the semiconductor channel extending substantially perpendicular to a major surface of a substrate and a plurality of control gate electrodes having a strip shape with major surfaces extending substantially parallel to the major surface of the substrate. The plurality of control gate electrodes comprise at least a first control gate electrode located in a first device level and a second control gate electrode located in a second device level located over the major surface of the substrate and below the first device level. The string also includes a blocking dielectric layer located in contact with the plurality of control gate electrodes, a charge storage region comprising metal silicide nanoparticles embedded in a charge storage dielectric matrix, and a tunnel dielectric layer located between the charge storage region and the semiconductor channel.

According to another embodiment of the invention, a monolithic three dimensional NAND memory device, comprises a silicon substrate; an array of monolithic three dimensional NAND strings having a plurality of device levels disposed above the silicon substrate; and driver circuits associated with the array located above or in the silicon substrate. Each monolithic three dimensional NAND string comprises a semiconductor channel, at least one end portion of the semiconductor channel extending substantially perpendicular to a major surface of the substrate; a plurality of control gate electrodes extending substantially parallel to the major surface of the substrate, wherein the plurality of control gate electrodes comprises at least a first control gate electrode located in a first device level and a second control gate electrode located in a second device level located over the major surface of the substrate and below the first device level; an interlevel insulating layer located between the first control gate electrode and the second control gate electrode; a blocking dielectric layer located in contact with the plurality of control gate electrodes and the interlevel insulating layer; a charge storage layer located at least partially in contact with the blocking dielectric layer, and wherein the charge storage layer comprises at least a first charge storage segment located in the first device level, a second charge storage segment located in the second device level, and a third charge storage segment located adjacent to the interlevel insulating layer between the first device level and the second device level; and a tunnel dielectric located between the charge storage layer and the semiconductor channel. The charge storage layer has a curved profile along at least one of the first charge storage segment and the third charge storage segment.

BRIEF DESCRIPTION OF THE DRAWINGS

FIGS. 1A-1B are respectively side cross sectional and top cross sectional views of a NAND string of one embodiment. FIG. 1A is a side cross sectional view of the device along line Y-Y' in FIG. 1B, while FIG. 1B is a side cross sectional view of the device along line X-X' in FIG. 1A.

FIGS. 2A-2B are respectively side cross sectional and top cross sectional views of a NAND string of another embodiment. FIG. 2A is a side cross sectional view of the device along line Y-Y' in FIG. 2B, while FIG. 2B is a side cross sectional view of the device along line X-X' in FIG. 2A.

FIGS. 3-4 are side cross sectional views of NAND strings of another two embodiments.

FIGS. 5A-5I illustrate a method of making a NAND string according to a first embodiment of the invention.

DETAILED DESCRIPTION

Figure 5A:
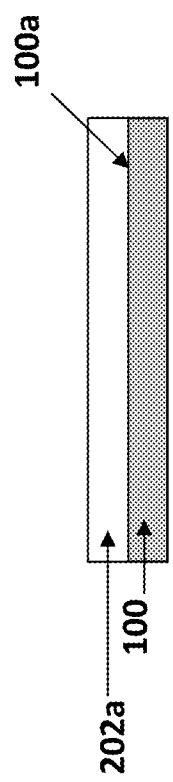

Embodiments of the present invention will be described below with reference to the accompanying drawings. It should be understood that the following description is intended to describe exemplary embodiments of the invention, and not to limit the invention.

The embodiments of the invention provide a monolithic, three dimensional array of memory devices, such as an array of vertical NAND strings. The NAND strings are vertically oriented, such that at least one memory cell is located over another memory cell. The array allows vertical scaling of NAND devices to provide a higher density of memory cells per unit area of silicon or other semiconductor material.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

In some embodiments, the monolithic three dimensional NAND string 150 comprises a semiconductor channel 1 having at least one end portion extending substantially perpendicular to a major surface 100a of a substrate 100, as shown in FIGS. 1A and 2A. For example, the semiconductor channel 1 may have a pillar shape and the entire pillar-shaped semiconductor channel extends substantially perpendicularly to the major surface of the substrate 100, as shown in FIGS. 1A and 2A. In these embodiments, the source/drain electrodes of the device can include a lower electrode 102a provided below the semiconductor channel 1 and an upper electrode 102b formed over the semiconductor channel 1, as shown in FIGS. 1A and 2A.

Alternatively, the semiconductor channel 1 may have a U-shaped pipe shape, as shown in FIGS. 3 and 4. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes 102a contacts the first wing portion of the semiconductor channel from above, and another one of a source or drain electrodes 102b contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are not shown in FIGS. 1-4 for clarity.

In an alternative embodiment, the semiconductor channel 1 may have a J-shaped pipe shape (not shown). A wing portion of the J-shaped pipe shape semiconductor channel may extend substantially perpendicular to the major surface of the substrate, and a second portion of the J-shaped pipe shape semiconductor channel extends substantially parallel to the major surface of the substrate. In these embodiments, one of the source or drain electrodes contacts the wing portion of the semiconductor channel from above, and another one of a source or drain electrodes contacts the second portion of the semiconductor channel from above or from below.

In some embodiments, the semiconductor channel 1 may be a filled feature, as shown in FIGS. 2A-2B and 4. In some other embodiments, the semiconductor channel 1 may be hollow, for example a hollow cylinder filled with an insulating fill material 2, as shown in FIGS. 1A-1B and 3. In these embodiments, and an insulating fill material 2 may be formed to fill the hollow part surrounded by the semiconductor channel 1.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. materials. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3 alternating with a plurality of interlevel insulating layers 19, as shown in FIGS. 1A-1B, 2A-2B, and 3-4. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, copper, aluminum, tantalum, titanium, cobalt, titanium nitride or alloys thereof. For example, in some embodiments, polysilicon is preferred to allow easy processing.

The monolithic three dimensional NAND string comprises a charge storage layer 9 located between a blocking dielectric 7 and the channel 1. The charge storage layer 9 may be continuous, and may have a substantially uniform thickness. For example the charge storage layer 9 having the substantially uniform thickness may have a variation in thickness in a horizontal direction parallel to the major surface 100a of less than or equal to 10%, such as from 0-10%, from 1-10%, or from 1-5% between device levels and interlevel regions adjacent to the interlevel insulating layers 19. The charge storage layer 9 comprises at least a first charge storage segment 9a located in the device level A, a second charge storage segment 9b located in the device level B, and a third charge storage segment 9c located adjacent to the interlevel insulating layer 19b between the device level A and the device level B, as shown in FIGS. 1A, 2A, 3 and 4.

The charge storage layer has a curved profile along at least one of the first charge storage segment 9a and the third charge storage segment 9c. In some embodiments, the charge storage layer 9 has a first curved profile along a first charge storage segment 9a, and a different, second curved profile along the third charge storage segment 9c. The second charge storage segment 9b may have the same curved profile as the first charge storage segment 9a. In an embodiment, the first charge storage segment 9a is convex in the direction of the first control gate electrode 3a, and the third charge storage segment 9c is concave in the direction of the interlevel insulating layer 19b, as shown in FIGS. 3 and 4.

The blocking dielectric 7 is located adjacent to the control gate(s) 3 and may surround the control gate 3 (not shown). The blocking dielectric 7 may be continuous, and may have a substantially uniform thickness. For example, dielectric 7 having the substantially uniform thickness may have a variation in thickness in a horizontal direction parallel to the major surface 100a of less than or equal to 10%, such as from 0-10%, from 1-10%, or from 1-5% between device levels and interlevel regions adjacent to the interlevel insulating layers 19. The blocking dielectric 7 comprises a plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIGS. 3 and 4.

The blocking dielectric 7 may have a complementary curved profile to the charge storage layer 9 along at least one segment where the blocking dielectric 7 is in contact with the charge storage layer 9. In other words, if a particular segment of the charge storage layer 9 is convex, then the adjacent segment of the blocking dielectric 7 is also convex, and vice versa.

The tunnel dielectric 11 of the monolithic three dimensional NAND string is located between the charge storage layer 9 and the semiconductor channel 1. The tunnel dielectric 11 may be continuous, and may have a substantially uniform thickness. For example, the tunnel dielectric 11 having the substantially uniform thickness may have a variation in thickness in a horizontal direction parallel to the major surface 100a of less than or equal to 10%, such as from 0-10%, from 1-10%, or from 1-5% between device levels and interlevel regions adjacent to the interlevel insulating layers 19. The tunnel dielectric 11 may have a complementary curved profile to the charge storage layer 9 along at least one segment where the tunnel dielectric 11 is in contact with the charge storage layer 9. In other words, if a particular segment of the charge storage layer 9 is convex, then the adjacent segment of the tunnel dielectric 11 is also convex, and vice versa.

The blocking dielectric 7 and the tunnel dielectric 11 may be independently selected from any one or more same or different electrically insulating materials, such as silicon oxide, silicon nitride, silicon oxynitride, metal oxide (e.g., $Al_2O_3$ or $HfO_2$), or other high-k insulating materials. The blocking dielectric 7 and/or the tunnel dielectric 11 may include multiple layers of silicon oxide, silicon nitride and/or silicon oxynitride (e.g., ONO layers) for tunnel dielectric 11, or silicon oxide and metal oxide for blocking dielectric 7.

The charge storage layer 9 may comprise a conductive (e.g., metal or metal alloy such as titanium, platinum, ruthenium, titanium nitride, hafnium nitride, tantalum nitride, zirconium nitride, or a metal silicide such as titanium silicide, nickel silicide, cobalt silicide, or a combination thereof) or semiconductor (e.g., polysilicon) floating gate, conductive nanoparticles, or a charge storage dielectric (e.g., silicon nitride or another dielectric) feature. Preferably, the charge storage layer 9 is a continuous charge storage dielectric which extends continuously along the channel 1 substantially perpendicular to the major surface 100a. In some embodiments, the charge storage layer 9 comprises discrete floating gates described above or discrete charge storage dielectric features, each of which comprises a nitride feature adjacent the respective blocking dielectric 7, where the silicon oxide blocking dielectric 7, the nitride feature 9 and the silicon oxide tunnel dielectric 11 form oxide-nitride-oxide discrete charge storage structures of the NAND string.

In some embodiments, the semiconductor channel 1 has a complementary curved profile to the tunnel dielectric 11 along at least one segment where the semiconductor channel 1 is in contact with the tunnel dielectric 11. In other words, if a particular segment of the tunnel dielectric 11 and an adjacent segment of the charge storage layer 9 are convex, then the adjacent segment of the semiconductor channel 1 is also convex, and vice versa.

In various embodiments, a segment of the NAND string perpendicular to the major surface 100a of the substrate 100 has a wavy profile, as shown in FIGS. 1A, 2A, 3, and 4. A wavy profile is defined as having one or more layers with complementary plural alternating convex/concave segments, where each segment has a non-zero radius of curvature. Preferably, the amplitude of the waviness is not less than 15% of the vertical separation between two neighboring gates. The blocking dielectric 7, the charge storage layer 9, and the tunnel dielectric 11 may each have a substantially uniform thickness. If the semiconductor channel 1 is a filled feature, as shown in FIGS. 2A-2B and 4, the semiconductor channel 1 of FIGS. 2A-2B, or the two wing portions 1a and 1b of the semiconductor channel 1 of FIG. 4 are quasi-cylindrical bodies having a variable thickness in a direction perpendicular to the major surface 100a of the substrate 100. In some other embodiments, shown in FIGS. 1A-1B and 3, where the semiconductor channel 1 is hollow and filled with an insulating fill material 2, the semiconductor channel 1 of FIGS. 1A-1B or the two wing portions 1a and 1b of the semiconductor channel of FIG. 3 have a wavy profile with a substantially uniform thickness, and the insulating fill material 2 is a quasi-cylindrical body having a variable thickness in a direction perpendicular to the major surface 100a of the substrate 100.

The wavy profile of the charge storage layer 9 results in a longer profile (in a direction substantially perpendicular to the major surface 100a) of the first and second curved charge storage segments 9a, 9b along the control gates 3a, 3b than a comparable flat segment of the charge storage layer. This longer, curved charge storage segments 9a, 9b provide a longer diffusion path for trapped electrons, and therefore reduces leakage to adjacent cells. The wavy profile of the charge storage layer 9 also enhances the electric field for the programmed cell (along charge storage segments 9a, 9b), and reduces the electric field in the spacing region adjacent the interlevel insulating layers (along charge storage segment 9c). As a result, interference between cells is reduced.

FIGS. 5A-5I illustrate a method of making a NAND string according to a first embodiment of the invention.

Referring to FIG. 5A, an optional etch stop layer 202a is formed over the major surface 100a of the substrate 100. The etch stop layer 202a may be, for example, a polysilicon layer. In some embodiments, the etch stop layer 202a comprises a conductive or heavily doped semiconductor (e.g., n or p-type doped with a concentration of at least $10^{18}$ $cm^{-3}$) material, and the etch stop layer 202a forms the electrode 102a. In other embodiments, the etch stop layer 202a comprises a sacrificial material, at least a portion of which is removed to provide a space to form an electrode 102a. In some embodiments, the etch stop layer 202a is an insulating or semiconductor material and remains in the completed device 150. In yet other embodiments, etch stop layer 202a is omitted.

As shown in FIG. 5B, a stack 120 of alternating first layers 19 (19a, 19b, etc.) and second layers 122 (122a, 122b, etc.) are formed over the etch stop layer 202a or over the major surface 100a of substrate 100 if the etch stop layer 202a is omitted. First layers 19 and second layers 122 may be deposited over the substrate by any suitable deposition method, such as sputtering, CVD, MBE, etc. First layers 19 may comprise an insulating material, for example a silicon oxide, in one embodiment, second layers 122 may comprise a conductive or semiconductive material, and the second layers 122 form the plurality of control gate electrodes 3. In another embodiment, second layers 122 are sacrificial layers, and may comprise a sacrificial material, such as intrinsic polysilicon or an insulating material (e.g., silicon nitride, silicon oxide, etc.). In these embodiments, the second layers 122 are removed, and a plurality of control gate electrodes is formed in their place by a replacement process.

The deposition of first layers 19 and second layers 122 is followed by etching the stack 120 to form at least one opening 84 in the stack 120, as shown in FIG. 5c. An array of openings 84 may be formed in locations where vertical channels or channel portions of NAND strings will be subsequently formed. The etching process forms a first curved profile 84c in the first layers 19, and a second curved profile 84a, 84b in the second layers 122. As shown in FIG. 5C, the first curved profile 84c is different from the second curved profile 84a, 84b. In some embodiments, the first curved profile 84c is convex in the direction of the opening 84 (i.e., curved sides of first layers 19 protrude into the opening 84), and the second curved profile 84a, 84b is concave in the direction of the opening 84 (i.e., curved sides of second layers 122 in the opening 84 curve inward into second layers 122).

In some embodiments, the etching of the stack comprises a dry etching process which results in the first curved profile 84c and the second curved profile 84a, 84b. For example, the dry etching process may be performed at any combination of parameters (e.g., pressure, temperature, chemical etchant, etc.) that results in the curved profile of the opening 84. In one embodiment, the etching of the stack comprises a first anisotropic etching process followed by a second selective etching process. For example, the first dry etching process may be a reactive ion etch, and the second selective etching process is a selective isotropic wet or dry etch which selectively recesses the second layers 122 compared to the first layers 19 to form the first curved profile 84c and the second curved profile 84a, 84b. In another embodiment, the etching of the stack is performed in a single step.

A blocking dielectric 7 (also known as an inter-poly dielectric, IPD) is then formed in the opening 84 such that the blocking dielectric coats the sides of the opening 84, resulting in a structure as shown in FIG. 5D. The blocking dielectric 7 may comprise a silicon oxide layer deposited by conformal atomic layer deposition (ALD) or chemical vapor deposition (CVD). Other high-k dielectric materials, such as hafnium oxide or aluminum oxide, or multi-layer dielectrics (e.g., ONO) may be used instead or in addition to silicon oxide. Optionally, an insulating capping layer (e.g., silicon nitride) may be deposited into the openings before the blocking dielectric 7 and may comprise a back portion of a multi-layer blocking dielectric. The blocking dielectric 7 follows the curvature of the opening 84 to form a first curved blocking segment 7c on the first layers 19, and second curved blocking segments 7a, 7b on the second layers 122. In some embodiments, the blocking dielectric 7 has a substantially uniform thickness, and the first curved blocking segment 7c is convex in the direction of the opening 84, and the second curved blocking segments 7a, 7b are concave in the direction of the opening 84.

A charge storage layer 9 is formed in the openings 84 over the blocking dielectric material 7, resulting in the structure shown in FIG. 5E. As explained above, in some embodiments, the charge storage layer 9 may comprise a charge storage dielectric material (e.g., silicon nitride). Alternatively, the charge storage layer 9 may comprise a conductive or semiconductor floating gate material (e.g., a metal, metal alloy such as TiN, metal silicide, or heavily doped polysilicon floating gate material). Any desired methods may be used to form the charge storage layer 9, such as ALD or CVD. The charge storage layer 9 follows the curvature of the blocking dielectric 7 to form a first curved charge storage segment 9c over the first layers 19, and second curved charge storage segments 9a, 9b over the second layers 122. In some embodiments, the charge storage layer 9 has a substantially uniform thickness, and the first curved charge storage segment 9c is convex in the direction of the opening 84, and the second curved charge storage segments 9a, 9b are concave in the direction of the opening 84. In other words, the first charge storage segment 9c is concave in the direction of the first layers 19, and the second charge storage segments 9a, 9b are convex in the direction of the second layers 122.

The tunnel dielectric 11 is deposited in the opening 84, over the charge storage layer 9, as shown in FIG. 5F. This may be accomplished, for example by depositing the tunnel dielectric material 11 with a chemical vapor deposition (CVD) processor an atomic layer deposition (ALD) process. The tunnel dielectric 11 follows the curvature of the charge storage layer 9 to form a first curved tunnel segment 11c over the first layers 19, and second curved tunnel segments 11a, 11b over the second layers 122. In some embodiments, the tunnel dielectric 11 has a substantially uniform thickness, and the first curved tunnel segment 11c is convex in the direction of the opening 84, and the second curved tunnel segments 11a, 11b are concave in the direction of the opening 84. In various embodiments, the charge storage layer 9 and the tunnel dielectric 11 have a wavy profile along substantially the length of the opening 84.

As illustrated in FIG. 5G, the channel 1 may be formed by depositing the semiconductor channel 1, which comprises a semiconductor material, such as a lightly doped or intrinsic polysilicon, in the opening 84. As discussed above, the entire opening 84 may be filled to form the device illustrated in FIGS. 2A, 2B, and 4. In various embodiments, the semiconductor channel 1 has a circular cross section when viewed from above, and the semiconductor channel 1 completely fills the opening 84 with a semiconductor channel material. Alternatively, the semiconductor channel 1 may first be deposited in the opening 84 followed by deposition of an insulating fill 2 to form the device illustrated in FIGS. 1A, 1B, and 3. In various embodiments, the semiconductor channel 1 has a circular cross section when viewed from above, and the semiconductor channel material is formed over the side wall of the opening 84 but not in a central part of the opening 84 such that the semiconductor channel material does not completely fill the opening 84. An insulating fill 2 is formed in the central part of the opening 84 to completely fill the opening 84. If desired, the channel 1 may be U-shaped, as illustrated in FIGS. 3 and 4.

The semiconductor channel 1 follows the curvature of the tunnel dielectric 11 to form a first curved channel segment 1c over the first layers 19, and second curved channel segments 1a, 1b over the second layers 122. In some embodiments, the semiconductor channel 1 has a substantially uniform thickness, and the first curved channel segment 1c is convex in the direction of the opening 84, and the second curved channel segments 1a, 1b are concave in the direction of the opening 84.

As shown in FIG. 5H, the insulating fill 2 is deposited to fill the opening in the semiconductor channel 1. The insulating fill 2 follows the curvature of the semiconductor channel 1 to form a quasi-cylindrical body having a variable thickness in a direction perpendicular to the major surface 100a of the substrate 100.

FIG. 5I shows the completed NAND string 150 including the plurality of control gate electrodes 3 and source and drain electrodes 102a, 102b formed in electrical contact with respective end portions of the semiconductor channel 1. In various embodiments, a first electrode 102b is formed in electrical contact with an upper end of the semiconductor channel 1, and a second electrode 102a is formed in electrical contact with a lower end of the semiconductor channel 1. In one embodiment, the plurality of control gate electrodes 3 are formed by etching the stack 120 to form a backside opening 184 (e.g., a slit trench or source electrode opening) in the stack such that the etch stop layer 202a is exposed. The etch stop layer 202a and the second layers 122 are removed from the stack 120 through backside opening 184 to form a plurality of recesses between the first layers 19, and the plurality of electrically conductive (e.g., metal, such as tungsten and/or metal nitride, such as TiN) control gates 3 and the source electrode 102a are formed in the plurality of recesses through the backside opening 184. In various embodiments, each of the plurality of control gates 3 has a profile complementary to the charge storage layer 9. In other embodiments, the source electrode 102a is in electrical contact with the lower end of the semiconductor channel 1 in the backside opening 184, and the drain electrode 102b is in electrical contact with the upper end of the semiconductor channel 1.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A monolithic three dimensional NAND string, comprising:
    a semiconductor channel, at least one end portion of the semiconductor channel extending substantially perpendicular to a major surface of a substrate;
    a stack of alternating first layers and second layers, wherein the alternating second layers include a plurality of control gate electrodes which extend substantially parallel to the major surface of the substrate, wherein the plurality of control gate electrodes comprises at least a first control gate electrode located in a first device level and a second control gate electrode located in a second device level located over the major surface of the substrate and below the first device level, and wherein the alternating first layers comprise an insulating material and include an interlevel insulating layer located between the first control gate electrode and the second control gate electrode;
    an opening vertically extending through the stack of alternating first layers and second layers and including a blocking dielectric layer located in contact with the plurality of control gate electrodes and the interlevel insulating layer; a charge storage layer located at least partially in contact with the blocking dielectric layer, and wherein the charge storage layer comprises at least a first charge storage segment located in the first device level, a second charge storage segment located in the second device level, and a third charge storage segment located adjacent to the interlevel insulating layer between the first device level and the second device level; and a tunnel dielectric located between the charge storage layer and the semiconductor channel;
    a first source or drain electrode located directly on the major surface of the substrate and laterally extending underneath an entirety of the opening and underneath the stack of alternating first layers and second layers; and
    a second source or drain electrode overlying the stack of alternating first layers and second layers and laterally extending over an entirety of the opening,
    wherein the charge storage layer has a curved profile along at least one of the first charge storage segment and the third charge storage segment;
    wherein the blocking dielectric layer, the charge storage layer and the tunnel dielectric are directly in contact with a major surface of the first source or drain electrode; and
    wherein a bottom surface of the second source or drain electrode is directly in contact with the blocking dielectric layer, the charge storage layer and the tunnel dielectric.

2. The monolithic three dimensional NAND string of claim 1, wherein the charge storage layer has a first curved profile along the first charge storage segment and a second curved profile along the third charge storage segment, wherein the second curved profile is different from the first curved profile.

3. The monolithic three dimensional NAND string of claim 2, wherein the first curved profile is convex in the direction of the first control gate electrode and the second curved profile is concave in the direction of the interlevel insulating layer.

4. The monolithic three dimensional NAND string of claim 2, wherein the charge storage layer has a substantially uniform thickness.

5. The monolithic three dimensional NAND string of claim 1, wherein the charge storage layer is continuous.

6. The monolithic three dimensional NAND string of claim 1, wherein the blocking dielectric layer has a complementary curved profile along at least one segment in contact with the charge storage layer.

7. The monolithic three dimensional NAND string of claim 6, wherein the blocking dielectric layer has a substantially uniform thickness.

8. The monolithic three dimensional NAND string of claim 6, wherein each control gate electrode of the plurality of control gate electrodes contacting the blocking dielectric layer has a complementary curved profile.

9. The monolithic three dimensional NAND string of claim 1, wherein the tunnel dielectric has a complementary curved profile along at least one segment in contact with the charge storage layer.

10. The monolithic three dimensional NAND string of claim 9, wherein the tunnel dielectric has a substantially uniform thickness.

11. The monolithic three dimensional NAND string of claim 9, wherein the semiconductor channel has a complementary curved profile along at least one segment in contact with the tunnel dielectric.

12. The monolithic three dimensional NAND string of claim 11, further comprising an insulating core fill layer contacting the semiconductor channel.

13. The monolithic three dimensional NAND string of claim 12, wherein:
the semiconductor channel is a hollow quasi-cylindrical body having walls with a substantially uniform thickness, and
the insulating core fill layer is located inside the hollow quasi-cylindrical body and has a variable thickness in a direction perpendicular to the major surface of the substrate.

14. The monolithic three dimensional NAND string of claim 1, wherein the charge storage layer has a wavy profile.

15. The monolithic three dimensional NAND string of claim 14, wherein blocking dielectric layer, the tunnel dielectric, and the semiconductor channel each have a complementary wavy profile to the charge storage layer.

16. The monolithic three dimensional NAND string of claim 1, wherein:
the charge storage layer comprises silicon nitride;
the tunnel dielectric comprises silicon oxide, silicon oxynitride or a combination of silicon oxide and silicon nitride; and
the blocking dielectric layer comprises silicon oxide.

17. The monolithic three dimensional NAND string of claim 1,
wherein the semiconductor channel has a pillar shape and extends substantially perpendicular to the major surface of the substrate; and
wherein the second source or drain electrode contacts the pillar-shaped semiconductor channel from above, and the first source or drain electrode contacts the pillar-shaped semiconductor channel from below.

18. The monolithic three dimensional NAND string of claim 1, wherein the electrode contacts a top surface of a topmost layer among the stack of alternating first layers and second layers.

* * * * *